United States Patent [19]

Kurihara et al.

[11] Patent Number: 4,663,762
[45] Date of Patent: May 5, 1987

[54] INNER STRIPE SEMICONDUCTOR LASER WITH STEPPED CHANNEL

[75] Inventors: Haruki Kurihara, Tokyo; Hideo Tamura, Kawasaki; Kazuo Suzuki; Kenji Matsumoto, both of Yokohama, all of Japan

[73] Assignee: Kabushiki Kaisha Toshiba, Kawasaki, Japan

[21] Appl. No.: 714,553

[22] Filed: Mar. 21, 1985

[30] Foreign Application Priority Data

Mar. 28, 1984 [JP] Japan .................................. 59-58136

[51] Int. Cl.⁴ .............................................. H01S 3/19
[52] U.S. Cl. ....................................... 372/45; 372/46; 372/48
[58] Field of Search ...................... 372/48, 46, 45, 44; 357/17

[56] References Cited

FOREIGN PATENT DOCUMENTS 0138977 10/1981 Japan ..................................... 372/48
0119883 7/1984 Japan ..................................... 372/48

OTHER PUBLICATIONS

S. Yamamoto et al., "Visible GaAlAs V-Channeled Substrate Inner Stripe Laser with Stabilized Mode Using p-GaAs Substrate", APL 40(5), Mar. 1, 1982, pp. 372-374.

Japanese Patent Disclosure (Kokai) No. 52-90280; R. Matsumoto; Jan. 22, 1976.

T. Hayakawa et al., "Highly Reliable and Mode-Stabilized Operation in V-Channeled Substrate Inner Stripe Lasers on p-GaAs Substrate Emitting in the Visible Wavelength Region", J. Appl. Phys. 53 (11), pp. 7224-7234, Nov., 1982.

Primary Examiner—James W. Davie
Attorney, Agent, or Firm—Cushman, Darby and Cushman

[57] ABSTRACT

An inner stripe with self-aligned saturable-absorber structure semiconductor laser comprises a semiconductor substrate of a first conductivity type; a semiconductor current-blocking layer (CBL) of a second conductivity type formed on the substrate and having a stepped channel composed of an optical-guiding channel and current-restricting channel which is grooved at the bottom of the optical-guiding channel through the CBL into the substrate; a semiconductor cladding layer of a first conductivity type formed over the CBL to bury the stepped channel; a semiconductor active layer of a first or second conductivity type formed on the cladding layer; and a semiconductor cladding layer of a second conductivity type formed on the active layer, whereby laser noises can be markedly suppressed through wide temperature fluctuations and through the optical feedback range.

9 Claims, 14 Drawing Figures

INNER STRIPE SEMICONDUCTOR LASER WITH STEPPED CHANNEL

BACKGROUND OF THE INVENTION

This invention relates to the inner stripe with self-aligned saturable-absorber (IS³) laser, which is characterized by its low noise operation.

Semiconductor lasers are employed in home-use optical-data processing systems such as digital audio disks (DAD) and video disks (VD). Semiconductor lasers enable the reduced size and cost and the marketability of these systems.

However, the noise characteristics of semiconductor lasers has required improvement before they could be ideally utilized in these systems. Noise suppression is essential for the VD players, which read analog signals, while DAD players, which read digital signals, have higher noise allowances. Noise suppression, however, also becomes critical in DAD players as their sizes decrease.

Relative-intensity-noise (RIN) levels of less than $5 \times 10^{-14}$ Hz$^{-1}$ and $1 \times 10^{-11}$ Hz$^{-1}$ are required in analog and digital playback systems, respectively. RIN is defined as RIN=$(\Delta P/P)^2/\Delta f$, where P is the average output power and $\Delta P$ is the noise power as measured in band $\Delta f$ around the center frequency fo.

Single-longitudinal-mode index-guided lasers suffer from mode-hopping noise, which is caused by ambient temperature, fluctuations and optical feedback noise, which is induced by the light reflecting back to the emitting facet. Thus, RIN is so high ($\sim 10^{-11}$ Hz$^{-1}$ around fo=200 KHz) that single-longitudinal-mode lasers are generally not used even in digital playback systems.

On the other hand, multi-longitudinal-mode gain-guided lasers are less sensitive to the temperature fluctuations and the light feedback because not all the longitudinal modes but a few are sensitive at the same time. Therefore, gain-guided lasers are preferably used in digital playback systems such as DAD players. However, competition among their longitudinal modes increases RIN as high as $1 \times 10^{-13}$ Hz. Therefore, gain-guided lasers cannot be used for analog playback systems such as VD players.

In FIG. 1, the oxide-stripe laser is depicted as an example of a gain-guided laser. The oxide-stripe laser comprises an n-type GaAs substrate 2, an n-type Al$_x$Ga$_{1-x}$As cladding layer 4, an n- or p-type Al$_y$Ga$_{1-y}$As ($0 \leq y < x \leq 1$) active layer 6, a p-type Al$_x$Ga$_{1-x}$As cladding layer 8, a p-type GaAs ohmic layer 10, a SiO$_2$ insulating layer 12 and metal electrodes 14 and 16. A pumping current is injected into the active layer 6 through the stripe window opened in the insulating layer 12. Thus, optical gain is restricted along the junction plane and single filament operation is realized. The oxide-stripe laser, as well as other gain-guided lasers, has a rather long astigmatic distance of about 20 μm or more. Therefore, some compensation optics are required when gain-guided lasers are utilized in optical playback systems.

FIG. 2 shows the channeled substrate planar (CSP) laser, which is disclosed in Japanese Patent Publication (Kokoku) No. 54-5273, as an example of index-guided lasers. The CSP laser comprises an n-type GaAs substrate 2 provided with an etched channel 18, an n-type Al$_x$Ga$_{1-x}$As cladding layer 4, an n- or p-type Al$_y$Ga$_{1-y}$As ($0 \leq y < x \leq 1$) active layer 6, a p-type Al$_x$Ga$_{1-x}$As cladding layer 8, a p-type GaAs ohmic layer 10, a SiO$_2$ insulating layer 12, and metal electrodes 14 and 16. In the region outside the channel 18, the n-type cladding layer 4 is thin enough for the optical field to penetrate the lossy substrate 2 and, therefore, an effective refractive index difference is provided. Thus, the optical field is confined to the channel region. The CSP laser, as well as other index-guided lasers, has short astigmatic distance of less than 5 μm. Therefore, for no compensation optics are necessary, using the CSP laser in optical playback systems. However, the CSP laser exhibits such a high value of RIN that it is hardly used, as described earlier.

Japanese Patent Disclosure (Kokai) No. 57-159084 discloses a V-channeled-substrate inner-stripe (VSIS) laser in which an n-type GaAs layer grown on p-type GaAs substrate acts as a current-blocking layer (CBL). The basic structure of this prior art is shown in FIG. 3. The VSIS laser comprises a p-type GaAs substrate 18, an n-type GaAs layer 20, which act as a CBL, a channel 34 etched into the CBL 20 to reach the substrate 18, a p-type Al$_x$Ga$_{1-x}$As cladding layer 22, a p- or n-type Al$_y$Ga$_{1-y}$As ($0 \leq y < x \leq 1$) active layer 24, an n-type Al$_x$Ga$_{1-x}$As cladding layer 26, an n-type GaAs ohmic layer 28, and metal electrodes 30 and 32. The index-guiding mechanism of the VSIS laser is similar to that of the CSP laser. In the VSIS laser, however, the current is also restricted in the channel 34 because of the CBL, while it is not restricted in the CSP laser. As a result, the VSIS laser has intermediate characteristics between a gain-guided laser and an index-guided laser, namely, multi-longitudinal-mode operation at low power level and rather short astigmatic distance (5~15 μm). Due to these favorable characteristics, the VSIS laser is preferably used in DAD players. However, the multi-longitudinal-mode VSIS laser generally exhibits higher value of RIN than required in analog playback systems such as VD players.

SUMMARY OF THE INVENTION

An object of the present invention is to provide a structure of semiconductor laser which operates with a value of RIN low enough and with a astigmatic distance short enough to be utilized in analog playback systems such as VD players.

According to this invention, there is provided a semiconductor laser comprising: a semiconductor substrate of a first conductivity type; a semiconductor current-blocking layer (CBL) of a second conductivity type formed on the substrate and having a stepped channel which is composed of an optical-guiding channel and a current-restricting channel, the latter channel being grooved at the bottom of the former channel through the CBL into the substrate; a semiconductor cladding layer of a first conductivity type over the CBL to bury the stepped channel; a semiconductor active layer of a first or second conductivity type formed on the cladding layer; and a semiconductor cladding layer of a second conductivity type formed on the active layer.

The optical-guiding channel has a width of 3 to 5 μm, preferably 3.8 to 4.2 μm, and a depth of 0.2 to 1.0 μm, preferably 0.3 to 0.8 μm. The current-restricting channel has a width of less than 2 μm, preferably 0.5 to 1.5 μm.

In the semiconductor laser of this invention, deformation-preventing layers can be inserted in the CBL so as to prevent the shoulders of the stepped channel from sagging during crystal growth. When the CBL is made of GaAs, the deformation-preventing layers can be made of $Al_xGa_{1-x}As$ ($0.1 < x < 1$) and are preferably less than 0.1 μm thick and are not exposed at the CBL surface.

The deformation-preventing layers should be formed such that they are exposed on side-walls of the optical-guiding channel and current-restricting channel, preferably near the shoulders of them.

In the semiconductor laser provided by this invention, the current injected into the active layer is reduced at the edges of the optical-guiding channel adequately to make these active layer portions act as saturable-absorbers. Thus, the saturable-absorbers are self-aligned on the optical-guiding channel edges and cause the self-pulse modulation of the laser oscillation. The self-pulse modulation makes coherent length of the emitted light reduce markedly. Thus, the inner stripe with self-aligned saturable-absorber ($IS^3$) laser, of the present invention is insensitive to the feedback light and temperature fluctuations.

DETAILED DESCRIPTION OF THE PREFERRED EMBODIMENTS

The operating mechanisms of an $IS^3$ laser, which uses a stepped channeled substrate, will be explained below in comparison with that of a conventional VSIS laser, which uses a V-channeled substrate.

Figure 1:
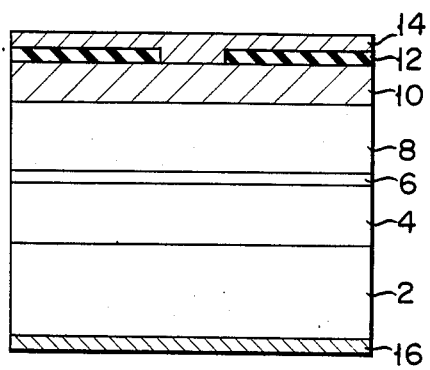
FIG. 1 is a cross-sectional view showing a conventional oxide-stripe type gain-guided laser.
Figure 2:
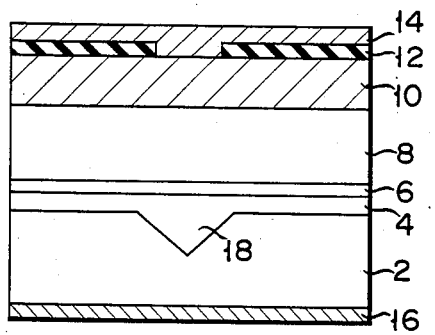
FIG. 2 is a cross-sectional view showing a conventional CSP type index-guided laser.
Figure 3:
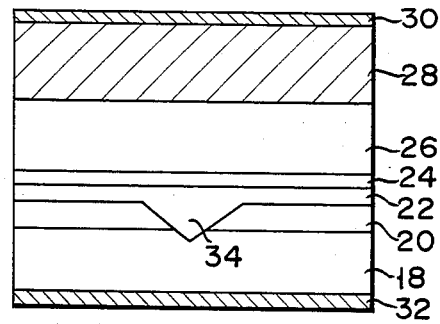
FIG. 3 shows a cross-sectional view showing a conventional VSIS laser.
Figure 4:
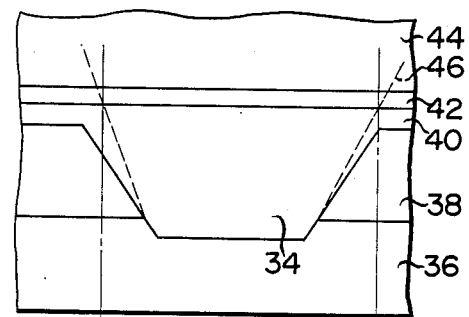
FIG. 4 is an explanatory diagram for the operating mechanisms of the conventional VSIS laser.
Figure 4:
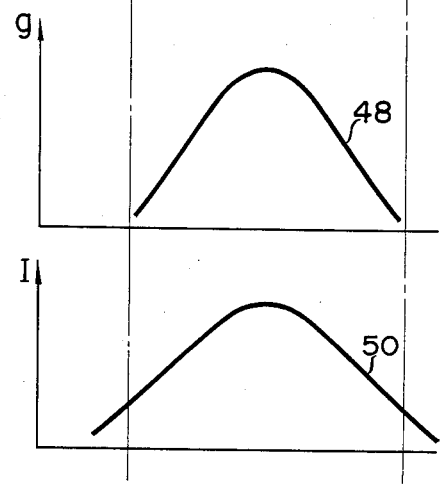
Figure 5:
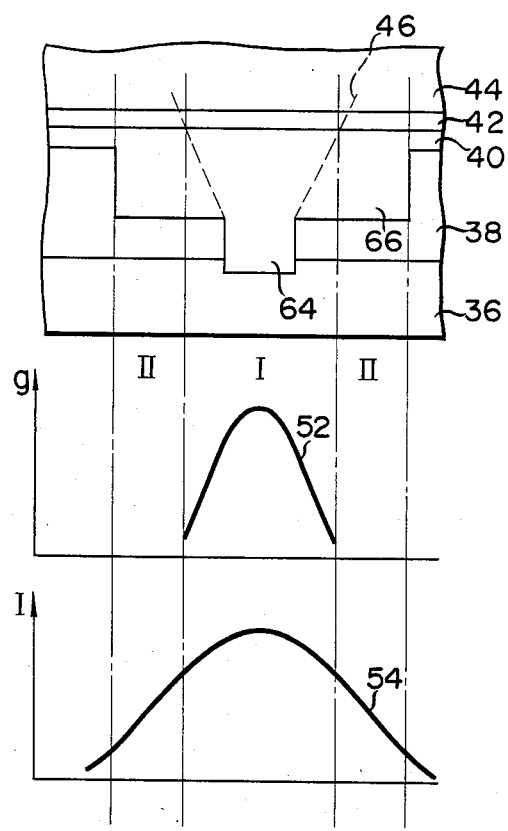
FIG. 5 is an explanatory diagram for the operating mechanisms of an $IS^3$ laser.
Figure 7:
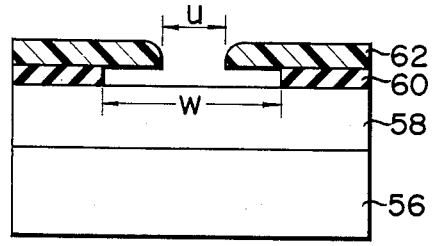

FIGS. 4 and 5 show channel portions of the VSIS laser and the $IS^3$ laser, respectively. In FIGS. 4 and 5, reference numerals, 36, 38, 40, 42 and 44 show a semiconductor substrate, a current-blocking-layer (CBL), a first cladding layer, an active layer, and a second cladding layer, respectively. The broken lines 46 in FIGS. 4 and 5 show that the current, injected through the stripe window opened in the CBL 38, spreads as it flows towards the active layer 42. Using the stepped channel, the current width at its bottleneck and the optical guide width can be varied independently, while they cannot be using the V-channel. Moreover, using the stepped channel, the bottle-neck of the current can be located much closer to the active layer 42, resulting in narrower current width in the active layer 42. Thus, the current injected into the active layer can be intentionally reduced at the edge regions (denoted by II in FIG. 5) of the optical guide. In FIGS. 4 and 5, gain distributions (48 and 52, respectively) and optical density distributions (50 and 54, respectively) are shown.

It is well known that the active layer of a semiconductor laser acts as a saturable-absorber when the injected current is reduced. Therefore, the saturable-absorbers are self-aligned at the edges of the wave guide when the stepped channel is used. It is also well known that self-pulse modulation arises and makes the laser insensitive to the optical feedback when the capacity of the saturable-absorbers is adequately adjusted. Therefore, the laser with such a low noise as to be used in VD players can be made more reproducibly using the stepped channel than using the V-channel.

An experimental result revealed that the broader the region II becomes, the higher becomes the maximum light power at which the self-pulse modulation ceases. Hence, the current-restricting channel 64 is preferred to be much narrower than the optical-guiding channel 66, while the optical-guiding channel 66 has to be narrower than the critical width for fundamental transverse mode operation. Consequently, the optical-guiding channel 66 is preferred to have a width of 3 to 5 μm and the current-restricting channel 64 is preferred to have a width of less than 2 μm.

As to the depth of the optical-guiding channel 66, it is preferably 0.2 to 1.0 μm. If it is greater than 1.0 μm, the current spreads substantially in the active layer 42 and the region II vanishes effectively. On the other hand, if the depth of the optical-guiding channel 66 is less than 0.2 μm, the channel cannot guide the optical field.

Reactive ion etching (RIE) is capable of fine pattern delineation with vertical etched walls. Therefore, RIE is an effective technique for grooving the stepped channel of the present invention.

The present invention will be explained below in connection with examples.

EXAMPLE 1

Figure 6:
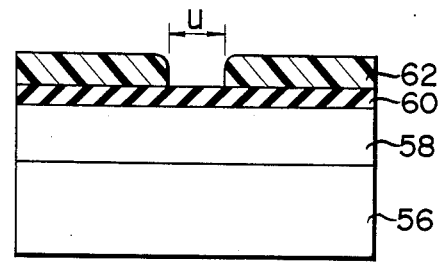
FIGS. 6 to 10 show cross-sectional views showing a manufacturing process of the semiconductor laser according to the embodiment of the present invention.

The $IS^3$ laser of the present invention was manufactured using the steps shown in FIGS. 6 to 10:

(1) As shown in FIG. 6, about 0.7 μm thick n-type GaAs layer (CBL) 58 was grown on the p-type GaAs substrate 56. Then, about 0.25 μm thick $SiO_2$ layer 60 was sputtered on the CBL 58. A photoresist layer 62 with a stripe window having a width u was made by photolithography.

(2) The $SiO_2$ layer 60 was selectively etched by buffered fluoric acid through the stripe window of the width u. The width w of the resultant stripe window opened in the $SiO_2$ layer 60 was controlled by the etching time (See FIG. 7).

Figure 8:
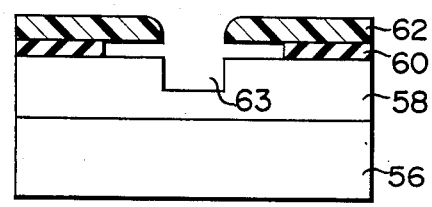

(3) The CBL 58 was etched by RIE, as shown in FIG. 8, using the photoresist layer 62 as a mask to form channel 63. The channel width was equal to the stripe window width u, while the channel depth was controlled by the etching time.

Figure 9:
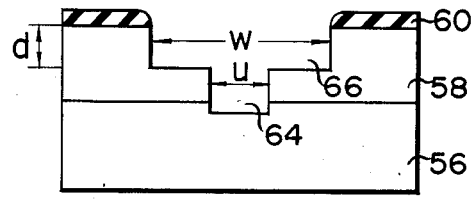

(4) After removing the photoresist layer 62, the CBL 58 was etched again by RIE as shown in FIG. 9. This time, the $SiO_2$ layer 60 was used as a mask. Thus, a stepped channel composed of a current-restricting channel 64 and a wave-guiding channel 66 was formed to reach the substrate 56. The width of the wave-guiding channel 66 was equal to the stripe window width w, while the depth was controlled by the etching time. On the other hand, the sizes of the current-restricting channel 64 were the same as those of the channel 63.

Figure 10:
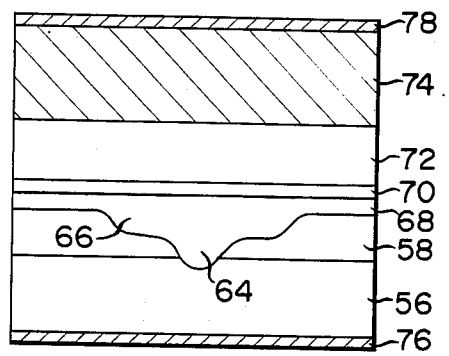

(5) After removing the $SiO_2$ layer 60, double-hetero (DH) structure with n-type GaAs ohmic layer 74 was grown by liquid phase epitaxy (LPE) on the channeled substrate as shown in FIG. 10. The DH structure was composed of a p-type $Al_{0.45}Ga_{0.55}As$ cladding layer 68, a p-type $Al_{0.13}Ga_{0.87}As$ active layer 70 and an n-type $Al_{0.45}Ga_{0.55}As$ cladding layer 72. Finally, metal electrodes 76 and 78 were formed on the rear and front surfaces, respectively.

EXAMPLE 2

Figure 11:
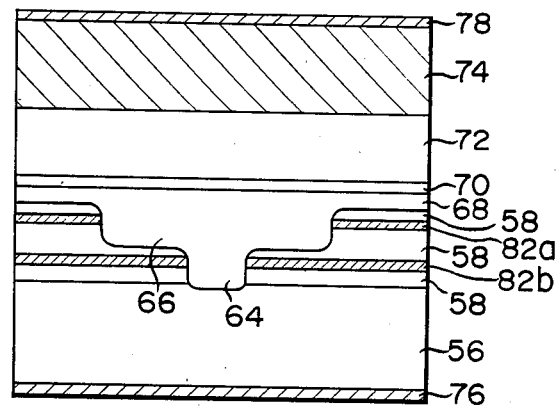
FIG. 11 shows a cross-sectional view showing a semiconductor laser according to another embodiment of the present invention.

As shown in FIG. 11, the fabrication procedure of the present example was the same as that of the former example except that $Al_{0.3}Ga_{0.7}As$ deformation-preventing layers 82a and 82b were inserted so as to be exposed at the side-walls of the optical-guiding channel 66 and the current-restricting channel 64, respectively. During the LPE of the DH structure, GaAs tends to migrate from the channel shoulders to the channel corners because surface energy is higher at shoulders than at corners. As a result, reproducibility of the channel sizes were poor without the deformation-preventing layers 82a and 82b. With these layers, the stepped channel was free from this deformation, which is generally called "mass-transfer", "melt-back" or "etch-back".

Figure 12:
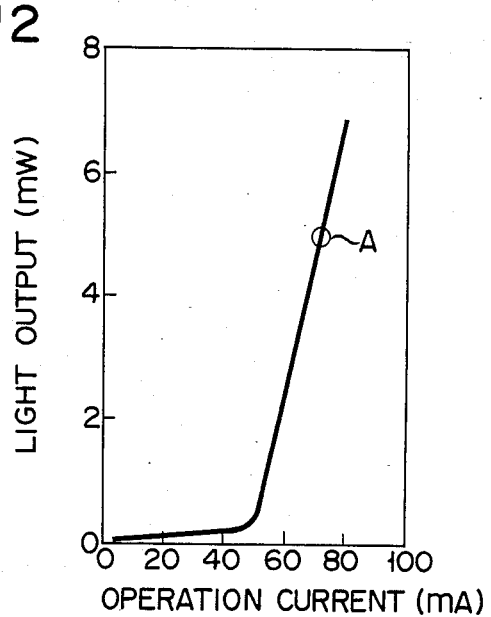
FIG. 12 shows a typical current-light characteristics of the semiconductor laser shown in FIG. 11.

FIG. 12 shows typical current-light characteristics of the $IS^3$ laser of the invention shown in FIG. 11.

Figure 13:
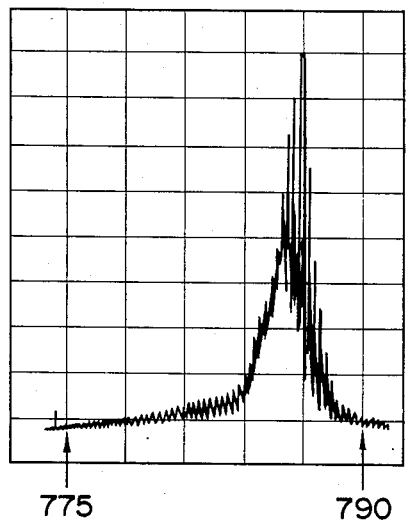
FIG. 13 shows a typical emission spectrum at 5 mW output (denoted by A in FIG. 12)

As shown in FIG. 13, the $IS^3$ laser of the present invention exhibits multi-longitudinal-mode operation. With the $IS^3$ laser, each longitudinal mode spectrum is broad, and the whole spectrum seems to be composed of overlapping spectra having differing mode spacing. This unique spectrum and self-pulse modulation observed in the $IS^3$ laser suggests that repetitive Q-switching is caused because of the self-aligned saturable-absorbers. Considering the well-known phenomena that the band gap and refractive index vary when the carrier density in the active layer varies, the $IS^3$ laser spectrum can be described as being derived from time domain variations in the carrier density during the repetitive Q-switching. Relative intensity noise (RIN) of the $IS^3$ laser was observed less than $1 \times 10^{-14} Hz^{-1}$ across a 10° C. to 60° C. temperature range and with optical feedback of up to 1%. This low noise property is attributed to the short coherent length derived from the self-pulse modulation, and it satisfies the noise specification for analog playback systems such as VD players. The $IS^3$ laser was observed to operate in a fundamental transverse mode with an astigmatic distance of less than 15 $\mu$m at output power of up to 10 mW.

EXAMPLE 3

Figure 14:
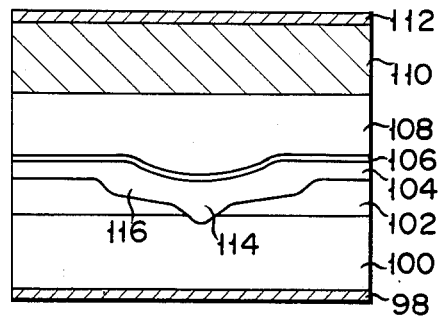
FIG. 14 shows a cross-sectional view of a laser according to another embodiment of the present invention.

FIG. 14 shows another example of the present invention. It is same as Example 1 shown in FIG. 10 except that the active layer 106 is bent down towards the stepped channel. This structure was easily made by setting the crystal growth time of the p-type cladding layer 104 shorter than that in the Example 1. In this structure, the current width in the active layer 106 is reduced because the active layer 106 is bent down so as to be located closer to the current-restricting channel 114. Moreover, a bent active layer forms an optical guide by itself and, therefore, the optical guide width is also reduced less than the width of the optical-guiding channel 116. Thus, with the bent active layer, the $IS^3$ structure is fabricated reproducibly even if the stepped channel is deformed during the LPE.

Although AlGaAs and GaAs have been used as semiconductor materials in the examples, this invention is not restricted to those materials. Any semiconductor materials may be used so long as they can be used for a laser diode. As to the masking materials for RIE, not only the photoresist and $SiO_2$, which were used in the examples, may be used, but also dielectric materials such as $Al_2O_3$ and $Si_3N_4$ can be used.

As described above in detail, the present invention provides the $IS^3$ (inner stripe with self-aligned saturable-absorbers) structure. The laser with this structure operates with low noise as well as a small astigmatic distance. Thus, using this invention, it is possible to manufacture semiconductor lasers suitable for analog playback systems, which require very low noise lasers with a small astigmatic distance.

What is claimed is:

1. An inner stripe semiconductor laser with a stepped channel, comprising:
   a semiconductor substrate of a first conductivity type;
   a semiconductor current-blocking layer (CBL) of a second conductivity type formed on the substrate and having a stepped channel composed of an optical-guiding channel and a current-restricting channel which is grooved at the bottom of the optical-guiding channel through the CBL into the substrate;
   a semiconductor cladding layer of a second conductivity type formed over the CBL to bury the stepped channel;
   a semiconductor active layer of a first or second conductivity type formed on the cladding layer;
   a semiconductor cladding layer of a second conductivity type formed on the active layer; and
   electrode means for applying current to said active layer.

2. A semiconductor laser according to claim 1, in which said optical-guiding channel is 3 to 5 $\mu$m in width and 0.2 to 1.0 $\mu$m in depth.

3. A semiconductor laser according to claim 2, in which said optical-guiding channel is 3.8 to 4.2 $\mu$m in width and 0.3 to 0.8 $\mu$m in depth.

4. A semiconductor laser according to claim 1, in which said current-restricting channel has a width of less than 2 $\mu$m.

5. A semiconductor laser according to claim 4, in which said current-restricting channel has a width of 0.5 to 1.5 $\mu$m.

6. A semiconductor laser according to claim 1, in which deformation-preventing layers are formed so as to be exposed at the side-walls of said optical-guiding channel and said current-restricting channel.

7. A semiconductor laser according to claim 6, in which said substrate and said CBL are made of GaAs and said deformation-preventing layer is made of $Al_xGa_{1-x}As$ where $$0.1 < x < 1.$$

8. A semiconductor laser according to claim 1, in which both of said cladding layers and said active layer are made of (AlGa)As and said substrate and said CBL are made of GaAs.

9. A semiconductor laser according to claim 1, in which said active layer is bent down towards said stepped channel.

* * * * *